United States Patent [19]

Zola

[11] Patent Number: 4,514,247
[45] Date of Patent: Apr. 30, 1985

[54] METHOD FOR FABRICATING COMPOSITE TRANSDUCERS

[75] Inventor: John Zola, Ramsey, N.J.

[73] Assignee: North American Philips Corporation, New York, N.Y.

[21] Appl. No.: 523,309

[22] Filed: Aug. 15, 1983

[51] Int. Cl.³ ............................................. B32B 31/00
[52] U.S. Cl. ........................... 156/250; 84/DIG. 24; 29/25.35; 156/254; 156/256; 156/264
[58] Field of Search ............... 156/250, 254, 256, 264; 84/DIG. 24; 29/25.35

[56] References Cited

U.S. PATENT DOCUMENTS

| | | | |
|---|---|---|---|
| 3,669,789 | 6/1972 | Utsugi et al. | 156/264 |
| 4,122,725 | 10/1978 | Thompson et al. | 310/336 |
| 4,398,325 | 8/1983 | Piaget et al. | 29/25.35 |

FOREIGN PATENT DOCUMENTS 3019478  11/1981  Fed. Rep. of Germany .

Primary Examiner—Jay H. Woo
Assistant Examiner—Timothy W. Heitbrink
Attorney, Agent, or Firm—Jack E. Haken

[57] ABSTRACT

A simplified method for fabricating composite transducers by bonding together plates of active and passive materials to form a laminated block. The active material is preferably a piezoelectric ceramic. Thereafter, a series of cuts are made in the laminated block to obtain a composite plate wherein regions of active material are separated from one another by regions of passive material. The method provides composite transducers having fine structures which can be produced without the difficulty of assembling many small rods or sawing deep, narrow grooves.

12 Claims, 9 Drawing Figures

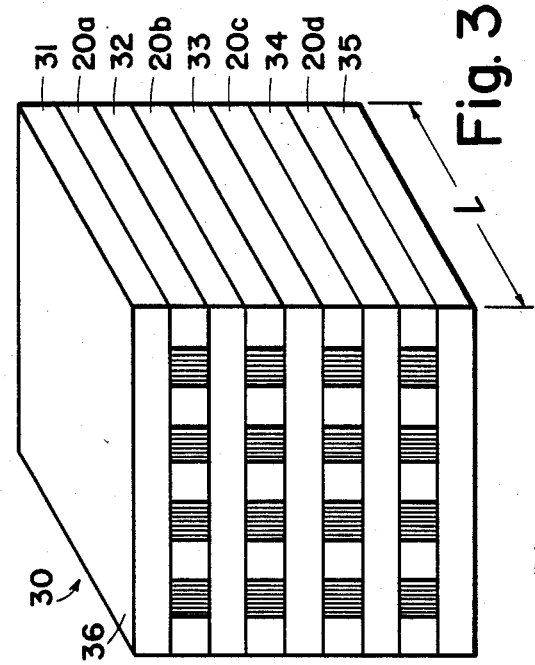
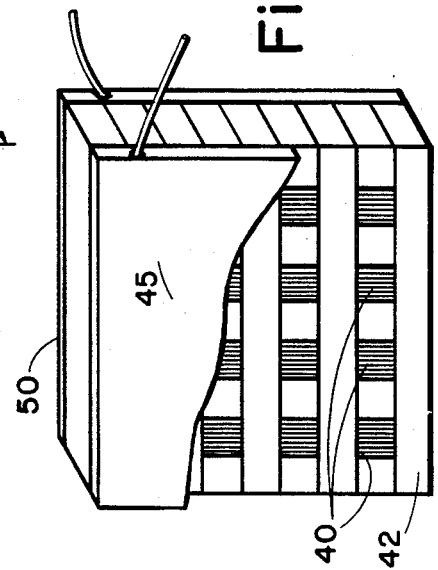
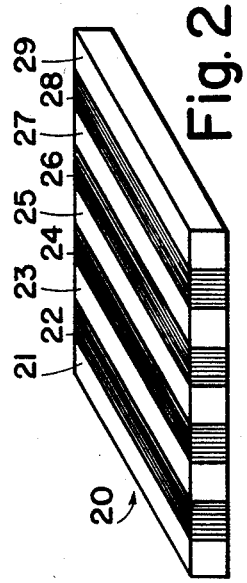
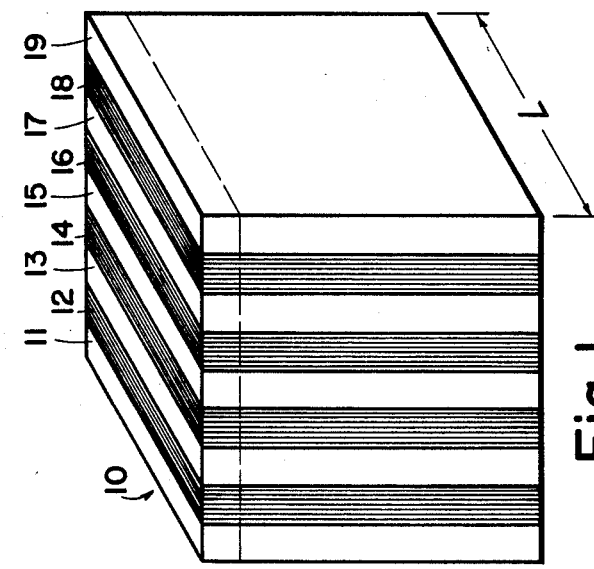

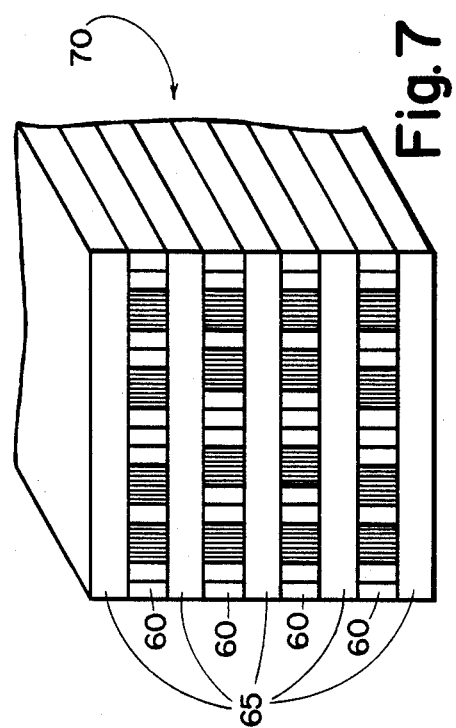
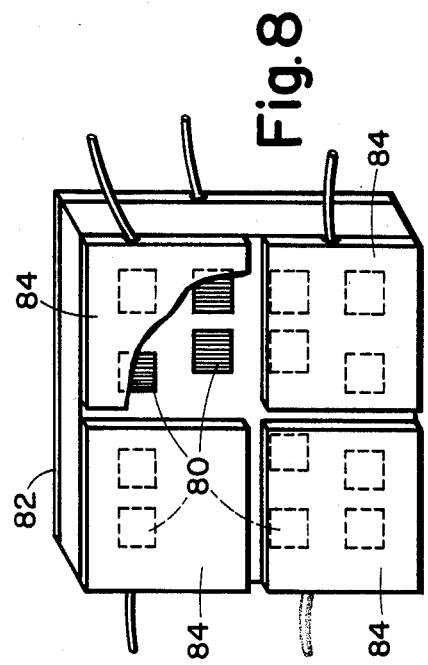
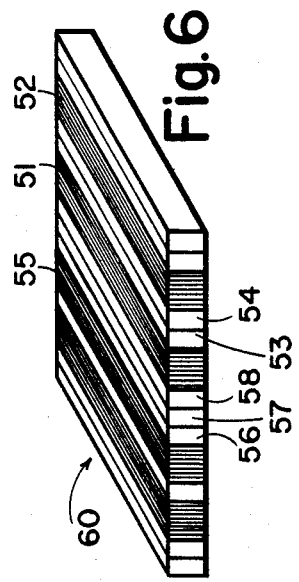
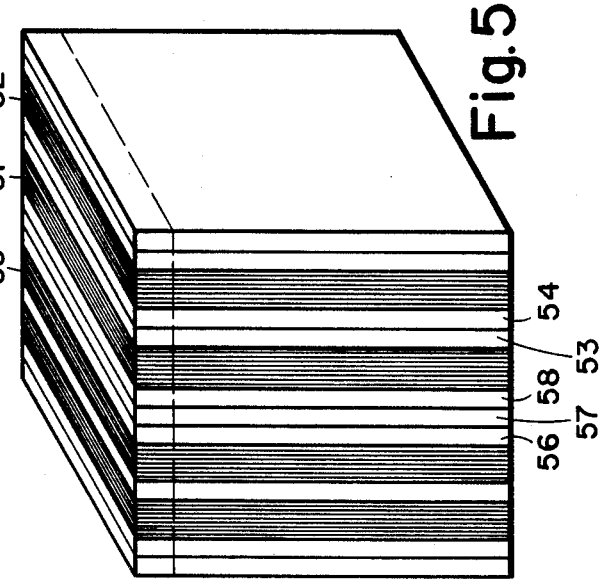

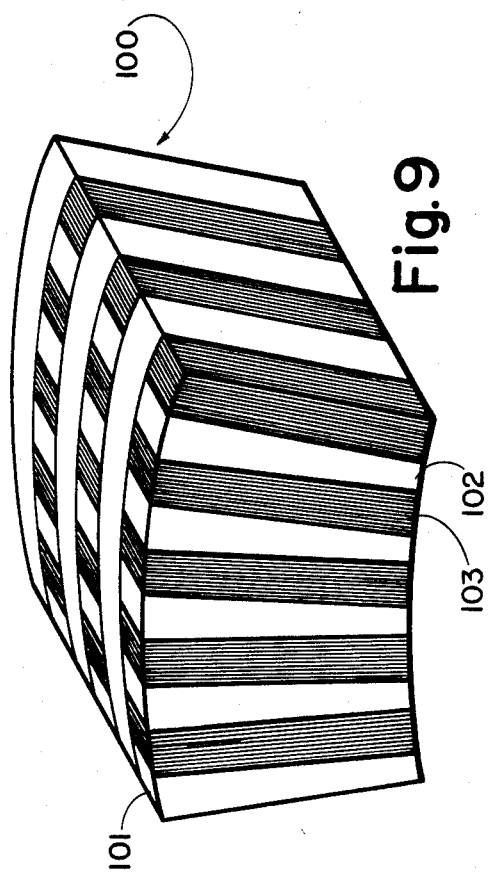

METHOD FOR FABRICATING COMPOSITE TRANSDUCERS

This invention relates to a method for fabricating composite materials and unique materials so fabricated. More particularly, the invention relates to a simplified method for fabricating composite ultrasound transducers by producing a block of material from laminated plates of piezoelectric and other materials and then cutting the block to obtain a matrix of isolated active regions having desired dimensions which are arranged in either an ordered or a random pattern. Composite transducers thus fabricated are particularly useful in medical apparatus.

BACKGROUND OF THE INVENTION

The term "composite transducer" as used herein denotes a transducer which includes regions of an electrically active material (i.e. a piezoelectric material) which are embedded in a matrix of a second material. Preferentially, the second material is an electrically passive material (i.e. an insulator). The second material may be elastometric or rigid and may have acoustic properties which are considerably different from the acoustic properties of the active material.

Composite piezoelectric transducers, and methods for their production, are described, for example, in *Composite Piezoelectric Transducers;* R. E. Newnham et al; Materials in Engineering, Vol. 2, December 1980, pages 93–106, which is incorporated herein, by reference, as background material.

In one prior art method for manufacturing composite transducers, piezoelectric material is extruded to form a continuous strand. The strand is then cut to form piezoelectric rods of a desired length. Parallel, spaced-apart rods are assembled in a fixture and the spaces between the rods are filled with resin (see, for example, U.S. Pat. No. 4,122,725). This method of assembling rods in a fixture is extremely tedious and is impractical when the center-to-center spacing of the rods is very small (for example on the order of 50 microns or less). Alignment fixtures having these fine dimensions are expensive and difficult to handle. Moreover, strands of piezoelectric material often take on unwanted curvatures which prevent accurate assembly in a fixture.

A method for fabricating transducers is also disclosed in German Patent No. 3124561. A block of piezoelectric material is grooved with two series of cuts, the second series lying at a 90° angle to the first series, to form a matrix of active regions. Passive material is then introduced into the grooves between the active regions and electrodes are attached to the individual elements.

German Patent No. 3019478 teaches a method for fabricating ultrasound transducer combs wherein the height of active transducer elements is substantially greater than their width. Strip-shaped plates of piezoelectric material are mounted in a stack, separated by spacers. A passive filler material is introduced betweeen the stacked plates. Several cuts are made in the stack, along a plane perpendicular to its width, to provide a transducer comb in which the transducer elements are parallel to one another. This method is not suitable for producing regions of active material having widths and heights on the order of 50 microns or less and does not yield active regions which are isolated from one another, on all sides, by passive material.

SUMMARY OF THE INVENTION

The present invention is a method for fabricating composite transducer materials by repeated lamination of plates of a first and a second material. In one embodiment of the invention, alternate plates of piezoelectric material and passive material are bonded together to form a block of interleaved plates of piezoelectric and passive material. The laminated block is then cut in a plane which is different from the plane of the sheets to form a plurality of laminated plates. The laminated plates are then again laminated with plates of passive material to form a second block which includes a matrix of active piezoelectric regions which are separated from each other, on all sides, by a matrix of passive material.

Many varied composite structures can be formed by the method of the present invention. For example, the laminated plates may be assembled so that the transducer elements on one plate are located at an angle with respect to the transducer elements on another laminated plate. Transducers may then be cut from this structure at a simple or compound angle to provide special structures wherein the transducer elements appear to be arranged in a random or specialized pattern.

In another embodiment of the invention, plates of active and passive material are laminated together in a random order. In certain applications, such random patterns may be utilized to fabricate a transducer array which exhibits reduced crosstalk.

The present invention allows the production of composite transducer materials wherein isolated active regions are spaced from each other at much smaller distances than were practically obtainable using prior art methods.

Accordingly, it is an object of the invention to provide a method for fabricating transducer materials which is simplier and less expensive than prior art methods of fabrication.

Another object of this invention is to provide a method for fabricating composite transducer materials for special applications wherein the active regions of the composite are arranged in a random or pseudo-random manner.

A further object of this invention is to provide a method for fabricating composite transducer materials having isolated active regions which are spaced at 50 microns or less from each other.

DESCRIPTION OF THE DRAWINGS

FIG. 1 is a block of composite transducer material formed by laminating alternate plates of piezoelectric material and passive material;

FIG. 2 is a laminated plate which has been cut from the block of FIG. 1.

FIG. 3 is a block of composite material formed by alternately laminating the plates of FIG. 2 with plates of passive material.

FIG. 4 is a composite transducer fabricated from the block of FIG. 3.

FIG. 5 is a laminated block of composite material formed from plates of piezoelectric material and passive material which have been bonded together in random order.

FIG. 6 is a laminated plate obtained by cutting the block of FIG. 5.

FIG. 7 is a block of composite material formed by randomly ordering plates of piezoelectric material of FIG. 6 with plates of passive material.

FIG. 8 is a composite transducer array fabricated from the block of FIG. 7.

FIG. 9 is a curved composite transducer in which active regions of piezoelectric material are separated by wedge-shaped regions of passive material.

DESCRIPTION OF PREFERRED EMBODIMENTS

FIG. 1 is a block of composite material 10 which is formed by laminating alternate plates of passive material 11, 13, 15, 17, 19 with plates of piezoelectric material 12, 14, 16, 18. The plates of piezoelectric and passive material may be produced by cutting them from a block of solid material and then lapping them to obtain the desired thickness. Alternately, the plates may be taken directly from sheets of those materials which are produced by other means, for example by extruding or rolling. The piezoelectric and passive materials are bonded to each other, for example with an epoxy adhesive. The passive material may, for example, be glass, paper, epoxy, phenolic resin, silicone rubber, or ceramic. The piezoelectric material may, for example, be a conventional PZT-5 (lead zirconium titanate) ceramic.

The laminated block is then cut along planes which lie perpendicular to the interfaces of laminated sheets (indicated for example by the dashed line in FIG. 1) to obtain laminated plates of passive and piezoelectric material. FIG. 2 illustrates a typical laminated plate 20 which comprises alternate strips of passive material 21, 23, 25, 27, 29 and piezoelectric material 22, 24, 26, 28.

As illustrated in FIG. 3, the laminated plates 20a, 20b, 20c, 20d are further bonded to plates of solid passive material 31, 32, 33, 34, 35 to form a second laminated block 30 which includes an array of parallel strips of piezoelectric material each of which is totally surrounded by passive material. The block 30 is then again cut, in a plane which is perpendicular to the strips of piezoelectric material, to produce a thin plate of composite piezoelectric material (FIG. 4) which includes isolated columns of solid piezoelectric material 40 in a matrix of passive material 42. Electrodes 45, 50 are applied in a known manner to the opposed faces of the transducer plate, for example by applying metal electrodes with a conductive adhesive or by use of a conductive paint to produce a completed piezoelectric transducer. Alternately, a pattern of electrodes may be applied over the ends of the individual columns of solid piezoelectric material or over groups of adjacent columns to produce a transducer array with individually addressable transducer elements.

In a typical embodiment, the individual piezoelectric strips 40 in FIG. 4 may have a height of 50 microns, a width of 50 microns, and a length of 500 microns. These dimensions are, however, exemplary since the dimensions of the transducer elements are a function of the desired operating frequency of the transducer.

Most prior art transducer arrays which were fabricated in a single block of transducer material suffered as a result of crosstalk between the individual transducer elements. The prior art teaches that transducer arrays which are fabricated in blocks of composite materials may be characterized by lower inter-element crosstalk than similar arrays that are fabricated from blocks of solid piezoelectric material. In accordance with the methods of the present invention, it is possible to produce a composite piezoelectric material in which the regions of piezoelectric material are distributed through the matrix of passive material in an irregular or random pattern. Transducers which are fabricated from blocks of composite piezoelectric material in which the regions of active piezoelectric material are distributed in such an irregular or random fashion may demonstrate even lower interelement crosstalk than a similar array of elements which is fabricated from a block of transducer material in which the the active piezoelectric regions are periodically distributed.

FIGS. 5 through 8 illustrate a method for producing a composite piezoelectric transducer in which the regions of active piezoelectric material are distributed in an irregular, pseudo-random pattern. The process of manufacturing such a transducer generally corresponds to the method illustrated with respect to FIGS. 1 through 4, respectively, expect that the passive layers in the first block of laminated plates (FIG. 5) each comprise a random number of plates of passive material. Thus, piezoelectric plates 51 and 52 are separated by two passive plates 53 and 54 while piezoelectric plates 51 and 55 are separated by three passive plates 56, 57 and 58. The block is then cut perpendicular to the plane of the plates to yield a laminated sheet 60 (FIG. 6). Laminated plates of FIG. 6 are then stacked with passive plates 65 to form a second laminated block 70 (FIG. 7). The orientation of the individual laminated plates may be randomly varied to distribute the regions of piezoelectric material throughout the laminated block 70 in an irregular manner. If desired, the passive plates 65 may comprise randomly distributed numbers of plates of passive material in the same manner as previously described with respect to FIG. 5.

FIG. 8 illustrates a composite transducer array. The block of FIG. 7 is cut along a plane perpendicular to the direction of the piezoelectric strips, to produce a composite plate having randomly distributed active regions 80. The back surface of the plate is provided with a common electrode 82. Four separate electrodes 84 are provided on the front surface of the plate and serve to define four elements of the transducer array. Each electrode 84 covers a plurality of active regions 80 in the plate (for the sake of clarity FIG. 8 shows only four active regions under each plate; however, in practice each electrode will contact hundreds or even thousands of separate active regions).

The method of the present invention may also be utilized to form curved sheets of transducer material in which the active piezoelectric regions are perpendicular to the face of the sheet. FIG. 9 illustrates such a transducer which may be directly utilized to form a focussed transducer or transducer array for medical imaging applications. The curved array is readily constructed by forming the laminated blocks 100 from tapered sheets of piezoelectric 103 and/or passive 101, 102 material 101. The orientation of the active piezoelectric regions within the composite may, of course, also be varied by changing the angles at which the various blocks of material are cut during manufacture.

Although the chief application of the method of the present invention is for the construction of piezoelectric ultrasound transducers, the invention is not so limited. The method may also be advantageously utilized, for example, for the construction of composite pyroelectric materials and for any other process which requires a finely structured composite of materials having varying electrical and/or mechanical properties.

EXAMPLE

A prototype piezoelectric composite material was manufactured by laminating flat sheets of PZT-5 piezoelectric ceramic, 150 microns thick, with glass cover plates, 150 microns thick, using an epoxy adhesive to form a first laminated block. The block was sliced perpendicular to the interfaces of the plates using a diamond saw to produce laminated plates which were then lapped to a thickness of approximately 150 microns. The laminated plates were then assembled, using an epoxy adhesive, to form a second laminated block which was again sliced, using a diamond saw, to produce a composite transducer plate having a thickness of approximately 2 millimeters.

The resultant transducer was tested at approximately 3.5 megahertz in a thickness mode and demonstrated piezoelectric properties. The composite material had a sonic velocity of approximately $4.7 \times 10^3$ meters per second and a coupling coefficient of approximately 0.4.

What is claimed:

1. A method for manufacturing composite transducers comprising the steps of:
    bonding together a plurality of plates of an electrically active material with plates of a passive material to form a laminated block having alternating regions of said electrically active material and said passive material;
    cutting the laminated block along planes which form an angle with the interfaces of the plates to obtain a plurality of laminated plates; and
    bonding said laminated plates together with a plurality of plates of additional passive material to form a laminated block which comprises strips of said electrically active material which are wholly surrounded by regions of said passive material.

2. The method of claim 1 wherein said electrically active material is a piezoelectric ceramic.

3. The method of claim 2 wherein said passive material is an electrical insulator which does not have piezoelectric properties.

4. The method of claim 3 wherein said passive material is glass.

5. The method of claim 2 wherein said electrically active material is a lead zirconium titanate.

6. The method of claim 1 wherein the regions of said electrically active material are periodically distributed throughout said block.

7. The method of claim 1, wherein successive regions of said passive material in the laminated plates are produced by binding together a varying number of plates of said passive material whereby the thickness of the regions of said passive material are irregularly distributed through the block.

8. The method of claim 1 wherein the plates of said electrically active and said passive material are flat plates.

9. The method of claim 2 further comprising the step of slicing said block perpendicular to the strips of said electrically active material to form a thin, composite piezoelectric plate and applying two or more electrodes to surfaces of said plate to form a composite piezoelectric transducer.

10. The method of claim 9 comprising the step of applying at least three electrodes to the surfaces of said plate to form an array of composite transducer elements.

11. The method of claim 10 wherein each electrode is applied over a plurality of said regions of piezoelectric material.

12. The method of claim 9 or 10 wherein at least some of the plates of said electrically active material and/or said passive material are tapered plates.

* * * * *